(12) United States Patent
Cai et al.

(10) Patent No.: US 9,281,476 B2
(45) Date of Patent: Mar. 8, 2016

(54) RESISTIVE MEMORY AND METHOD FOR FABRICATING THE SAME

(71) Applicant: PEKING UNIVERSITY, Beijing (CN)

(72) Inventors: Yimao Cai, Beijing (CN); Shihui Yin, Beijing (CN); Ru Huang, Beijing (CN); Yichen Fang, Beijing (CN)

(73) Assignee: Peking University, Beijing (CN)

( * ) Notice: Subject to any disclaimer, the term of this patent is extended or adjusted under 35 U.S.C. 154(b) by 0 days.

(21) Appl. No.: 14/354,919

(22) PCT Filed: Jul. 8, 2013

(86) PCT No.: PCT/CN2013/079020
§ 371 (c)(1),
(2) Date: Apr. 28, 2014

(87) PCT Pub. No.: WO2014/094417
PCT Pub. Date: Jun. 26, 2014

(65) Prior Publication Data
US 2015/0144861 A1    May 28, 2015

(30) Foreign Application Priority Data

Dec. 19, 2012  (CN) .......................... 2012 1 0555373

(51) Int. Cl.
*H01L 43/02* (2006.01)
*H01L 45/00* (2006.01)

(52) U.S. Cl.
CPC ............ *H01L 45/1233* (2013.01); *H01L 45/04* (2013.01); *H01L 45/085* (2013.01); *H01L45/1253* (2013.01); *H01L 45/1266* (2013.01); *H01L 45/1273* (2013.01); *H01L 45/146* (2013.01); *H01L 45/16* (2013.01); *H01L 45/1608* (2013.01)

(58) Field of Classification Search
CPC .......... H01L 21/34; H01L 43/02; H01L 43/12
USPC ................................................... 257/4; 438/3
See application file for complete search history.

(56) References Cited

U.S. PATENT DOCUMENTS 7,521,705 B2    4/2009  Liu
(Continued)

FOREIGN PATENT DOCUMENTS

CN         101488555          7/2009
CN         102157688 A        8/2011
(Continued)

*Primary Examiner* — Michael Lebentritt
(74) *Attorney, Agent, or Firm* — Bret E. Field; Bozicevic, Field & Francis LLP (57) ABSTRACT

Embodiments of the present invention disclose a resistive memory and a method for fabricating the same. The resistive memory comprises a bottom electrode, a resistive layer and a top electrode. The resistive layer is located over the bottom electrode. The top electrode is located over the resistive layer. A conductive protrusion is provided on the bottom electrode. The conductive protrusion is embedded in the resistive layer, and has a top width smaller than a bottom width. Embodiments of the present invention further disclose a method for fabricating a resistive memory. According to the resistive memory and the method for fabricating the same provided by the embodiments of the present invention, by means of providing the conductive protrusion on the bottom electrode, a "lightning rod" effect may be occurred so that an electric field in the resistive layer is intensively distributed near the conductive protrusion. This significantly increases the possibility of generation of a conductive filament at the conductive protrusion, so that the conductive filament is not randomly formed. Thus, the stability of various parameters of the resistive memory is ensured, and thus the reliability and stability of the operation of the resistive memory are dramatically increased.

1 Claim, 7 Drawing Sheets

(56) References Cited

U.S. PATENT DOCUMENTS

| | | | |
|---|---|---|---|
| 7,595,522 B2 * | 9/2009 | Takeuchi | 257/298 |
| 2008/0283616 A1 * | 11/2008 | Yukawa et al. | 235/492 |
| 2010/0019218 A1 * | 1/2010 | Chung | 257/4 |
| 2011/0227045 A1 | 9/2011 | Borghetti et al. | |

FOREIGN PATENT DOCUMENTS

| | | |
|---|---|---|
| CN | 102708919 A | 10/2012 |
| CN | 102738386 | 10/2012 |
| CN | 103035840 A | 4/2013 |
| TW | 2008/40026 * | 8/2010 |

* cited by examiner

RESISTIVE MEMORY AND METHOD FOR FABRICATING THE SAME

CROSS REFERENCE OF RELATED APPLICATIONS

The present application claims priority of Chinese application No. 201210555373.6, filed on Dec. 19, 2012, which is incorporated herein by reference in its entirety.

FIELD OF THE INVENTION

The present invention refers to a semiconductor device, and particularly, to a resistive memory and a method for fabricating the same.

BACKGROUND OF THE INVENTION

As charge-based non-volatile memories, a flash memory as a representative thereof, is gradually approaching its physical limits, a resistive memory, which is very likely to replace the charge-typed non-volatile memories, has been widely studied during the last decade. Compared to other types of non-volatile memories, the resistive memory has the following advantages: simple structure, fast speed, compatibility with existing fabrication techniques for field effect transistors, potential to be further scaled down and multi-value storage.

A conductive filament theory being as a conductive mechanism of the resistive memory has been widely recognized in academia. This theory holds that a resistance change of the resistive memory occurs due to the forming and breaking of a conductive filament in a resistive layer connected to two electrodes at both sides of the resistive layer. That is, oxygen vacancies or metal ions in the resistive layer produced through electro-chemical reactions migrate under an externally applied electric field, so that a conductive filament is formed. When the conductive filament is formed and thus is connected to the two electrodes, the resistive memory enters into a low resistance state. On the other hand, when the filament is affected thermally or under a reverse electric field, it may break partially or even completely and thus the resistive memory enters into a high resistance state. However, numerous key parameters of the resistive material fluctuate greatly due to the randomness of the forming and breaking of the conductive filament. Such fluctuation significantly degrades the stability and reliability of the operation of the resistive memory and at the same time increases the complexity of peripheral circuits, which becomes a serious obstacle in practical applications.

SUMMARY OF THE INVENTION

Embodiments of the present invention provide a resistive memory and a method for fabricating the same. By means of arranging a conductive protrusion on a bottom electrode of the resistive memory, a "lightning rod" effect is occurred and thus the stability of forming and breaking of a conductive filament are significantly improved.

In an aspect, an embodiment of the present invention provides a resistive memory. The resistive memory includes a bottom electrode, a resistive layer and a top electrode; the resistive layer is located over the bottom electrode; the top electrode is located over the resistive layer; a conductive protrusion is provided on the bottom electrode; the conductive protrusion is embedded in the resistive layer, and has a top width smaller than a bottom width.

In another aspect, embodiments of the present invention provide a method for fabricating a resistive memory. The method includes forming a bottom electrode on a substrate; forming a conductive protrusion having a top width smaller than a bottom width on the bottom electrode; forming a resistive layer on the bottom electrode and the conductive protrusion, so that the conductive protrusion is embedded in the resistive layer; forming a top electrode on the resistive layer.

It can be seen from the above technical features that, according to the resistive memory provided by the embodiments of the present invention, by means of providing the conductive protrusion on the bottom electrode, a "lightning rod" effect may be occurred so that an electric field in the resistive layer is intensively concentrated near the conductive protrusion. This significantly increases the possibility of generation of the conductive filament at the conductive protrusion, so that the conductive filament is not randomly formed any more. Thus, the stability of various parameters of the resistive memory is ensured, and thus the reliability and stability of the operation of the resistive memory are dramatically increased.

BRIEF DESCRIPTION OF THE DRAWINGS

In order to more clearly illustrate the technical solutions in the embodiments of the present invention or in the prior art, the accompanying drawings used in the embodiments will be described briefly hereinafter. Apparently, the drawings in the following descriptions merely illustrate the embodiments of the present invention, and those ordinary persons skilled in the art can obtain other drawings based on these, which requires no creative efforts. With reference to the drawings, the above and other objects, features and advantages of the present invention will become more apparent. Throughout the drawings, same reference numerals indicate same parts. The drawings are not necessarily scaled according to the actual sizes, but focusing on illustrating the spirit of the present invention.

DETAILED DESCRIPTION OF THE EMBODIMENTS

Hereinafter, the technical solutions in the embodiments of the present invention will be described clearly and thoroughly with reference to the drawings of the embodiments of the present invention. It is apparent that the described embodiments are only part of the implantations of the invention rather than all of them. Based on the embodiments of the present invention, other implantations made by those ordinary persons skilled in the art without any create efforts will fall in the scope of the present invention.

Moreover, the present invention is described with reference to schematic diagrams. For convenience of descriptions of the embodiments, the cross sectional views illustrating the device structures may not follow the common proportion and may be partially exaggerated. Besides, those schematic diagrams are merely examples, and not intended to limit the scope of the invention. Furthermore, a three-dimensional size including length, width and depth should be considered during practical fabrication.

Figure 1:
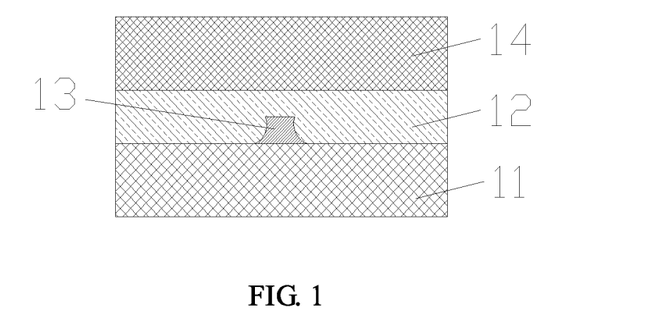
FIG. 1 is a schematic diagram illustrating a structure of a resistive memory provided by an embodiment of the present invention.

Referring to FIG. 1, FIG. 1 is a schematic structure diagram of a resistive memory provided by an embodiment of the present invention.

The resistive memory includes a bottom electrode 11, a resistive layer 12 and a top electrode 14. The resistive layer 12 is located over the bottom electrode 11, and the top electrode 14 is located over the resistive layer 12. A conductive protrusion 13 is provided on the bottom electrode 11. The conductive protrusion 13 is embedded in the resistive layer 12, and has a top width smaller than a bottom width. It is noted that, a top of the conductive protrusion refers to a portion close to the top electrode, and a bottom of the conductive protrusion refers to a portion located at the bottom electrode.

Alternatively, the top width of the conductive protrusion 13 ranges from 10 nm to 30 nm, which is approximate to a diameter range of a conductive filament so that a growth path of the conductive filament can be well controlled. A growth thickness of the conductive protrusion 13 may range from 40 nm to 60 nm.

The conductive protrusion 13 is formed of any reactive metal conductive material that is known or forthcoming, such as any one selected from Cu, Al, Ti, TiN, Ag and Ni. The bottom electrode 11 is formed of any inert metal conductive material that is known or forthcoming, such as Pt or Au. It is noted that, in order for the bottom electrode not being etched while forming the conductive protrusion by using an etching process, a conductive material more active than the material for the bottom electrode is selected to be used as the material for the conductive protrusion. Meanwhile, such a selection facilitates a fast and stable formation of a conductive filament when the resistive memory is under an externally applied electric field.

Alternatively, a growth thickness of the bottom electrode 11 may range from 50 nm to 200 nm. A growth thickness of the top electrode 14 may range from 50 nm to 200 nm. The top electrode 14 is formed of any metal conductive material that is known or forthcoming, such as Pt or Au.

It is noted that, the growth thickness of the top electrode may be or may not be the same as that of the bottom electrode. Also, the material of the top electrode may be or may not be the same as that of the bottom electrode. The growth thicknesses and the materials are not limited herein.

Alternatively, a thickness of the resistive layer 12 may range from 70 nm to 100 nm, where the thickness of the resistive layer 12 is larger than that of the conductive protrusion 13. In particular, a difference in thicknesses between the resistive layer 12 and the conductive protrusion 13 may be determined according to specific conditions, and is not limited herein.

Figure 2:
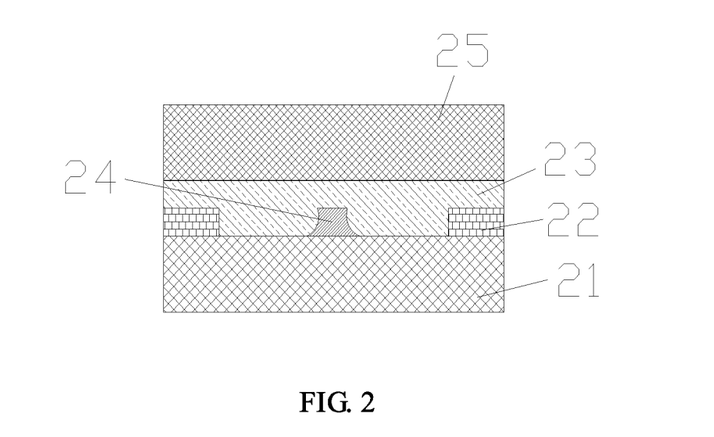
FIG. 2 is a schematic diagram illustrating another structure of a resistive memory provided by an embodiment of the present invention.

A resistive memory with another structure provided by another embodiment of the present invention is shown in FIG. 2.

On a basis of the above-mentioned embodiment, except for a bottom electrode 21, a resistive layer 23, a top electrode 25 and a conductive protrusion 24, the resistive memory according the embodiment further provides an isolation layer 22 at both sides of the conductive protrusion 24 on the bottom electrode 21, where a growth thickness of the isolation layer 22 on the bottom electrode 21 is same as that of the conductive protrusion 24.

Among them, the bottom electrode 21, the resistive layer 23, the top electrode 25 and the conductive protrusion 24 are similar to the bottom electrode, the resistive layer, the top electrode and the conductive protrusion in the above-mentioned embodiment, respectively. The detailed description is there omitted.

It is noted that, a material for the isolation layer may be silicon nitride. The isolation layer may serve as an electrical isolation between adjacent resistive memories when the resistive memory is integrated in a large scale. Moreover, the isolation layer may serve as a stop layer when the resistive layer is subject to a chemical mechanical polishing process during fabrication of the resistive memory.

It can bee seen from the above-mentioned embodiments, according to the resistive memory provided by the embodiments of the present invention, by means of providing the conductive protrusion on the bottom electrode, a "lightning rod" effect may be occurred so that an electric field in the resistive layer is intensively distributed near the conductive protrusion. This significantly increases the possibility of generation of the conductive filament at the conductive protrusion, so that the conductive filament is not randomly formed. Thus, the stability of various parameters of the resistive memory is ensured, and thus the reliability and stability of the operation of the resistive memory are dramatically increased.

Accordingly, a method for fabricating a resistive memory is further provided by an embodiment of the present invention.

Figure 3:
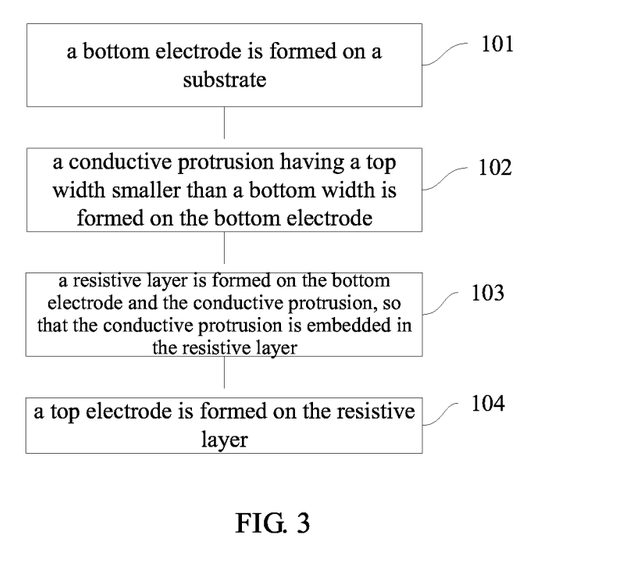
FIG. 3 is a flow chart showing a method for fabricating a resistive memory provided by an embodiment of the present invention.

As shown in FIG. 3, FIG. 3 is flow chart illustrating a method for fabricating a resistive memory according to an embodiment of the present invention. The method includes following steps.

At step 101, a bottom electrode is formed on a substrate.

The substrate may be a polysilicon substrate or other semiconductor substrate. The bottom electrode may be deposited through a chemical vapor deposition method or a physical vapor deposition method.

Alternatively, a thickness of the bottom electrode ranges from 50 nm to 200 nm. However, the specific thickness may be determined according to various conditions, and thus is not limited herein.

Alternatively, the bottom electrode may be formed of any material that is known or forthcoming, such as Pt or Au.

At step 102, a conductive protrusion having a top width smaller than a bottom width is formed on the bottom electrode.

One of methods for forming the conductive protrusion may include following steps.

Figure 5:
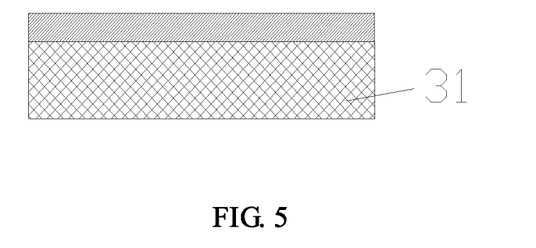
FIGS. 5-10 are schematic views showing a fabrication of a resistive memory provided by an embodiment of the present invention.
Figure 6:
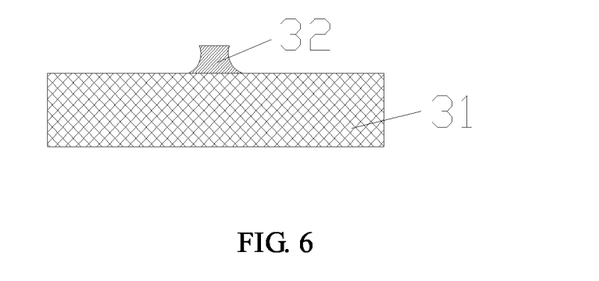

As shown in FIG. 5, a layer of active conductive material (the active conductive material refers to a conductive material that is more active than a material for the bottom electrode) is deposited on the bottom electrode 31 through a chemical vapor deposition method or a physical vapor deposition method. As shown in FIG. 6, a conductive protrusion 32 having a top width smaller than a bottom width is formed by etching the active conductive material through a wet anisotropy etching process.

Alternatively, a top width of the conductive protrusion 32 ranges from 10 nm to 30 nm. A growth thickness of the conductive protrusion 32 ranges from 40 nm to 60 nm. The conductive protrusion 32 is formed of any metal conductive material that is known or forthcoming, such as any one selected from Cu, Al, Ti, TiN, Ag and Ni.

It is noted that, a selection of an etching agent is associated with the specific conductive material. The etching agent is required not to react with the bottom electrode or to have a very slow reaction speed with the bottom electrode, and is required to have a low concentration, and an etching speed of the corresponding active conductive material is controlled to be 5-30 angstrom/second. Meanwhile, in order to ensure the stability and the anisotropy of the etching agent, a stirring step is required during etching.

The conductive protrusion may be formed by various methods of which the detailed descriptions will be seen in the following embodiments.

At step 103, a resistive layer is formed on the bottom electrode and the conductive protrusion, so that the conductive protrusion is embedded in the resistive layer.

One of methods for forming the resistive layer may include following steps.

Figure 7:
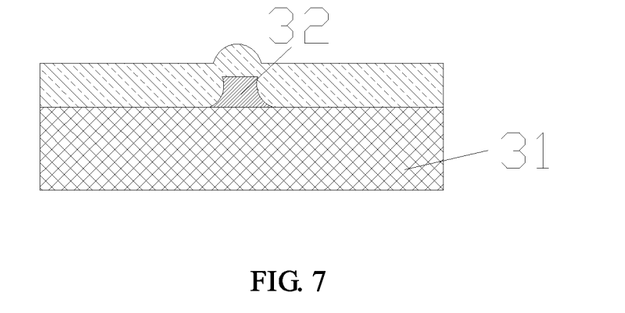
Figure 8:
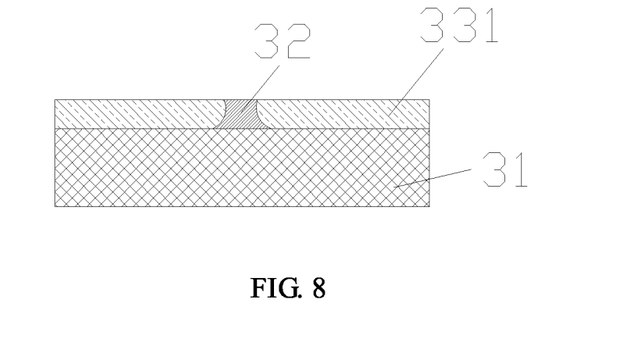
Figure 9:
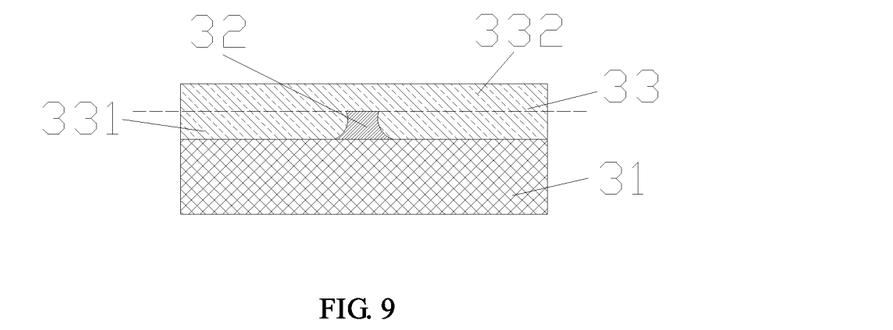

As shown in FIG. 7, a resistive material is deposited on the bottom electrode 31 and the conductive protrusion 32 through a chemical vapor deposition method or a physical vapor deposition method. Since the conductive protrusion 32 is protruded from the bottom electrode 31, the deposited resistive material has an uneven upper surface. As shown in FIG. 8, the resistive material is subject to a chemical mechanical polishing by using the conductive protrusion 32 as a stop layer, so that a first resistive layer 331 having an even upper surface is formed. As shown in FIG. 9, a second resistive layer 332 is further formed by depositing a resistive material on the first resistive layer 331 (in FIG. 9, a dotted line is indicated for clearly illustrating ranges of the first resistive layer and the second resistive layer, not included in the content of the embodiments of the present invention, neither limiting the present invention in any way). The first resistive layer 331 and the second resistive layer 332 are together to form a resistive layer 33.

It is noted that, the first resistive layer is formed of a material which is the same as a material for forming the second resistive layer.

Alternatively, a thickness of the resistive layer ranges from 70 nm to 100 nm.

The resistive layer may be formed by various methods, of which the detailed descriptions will be seen in the following embodiments.

At step 104, a top electrode is formed on the resistive layer.

Figure 10:
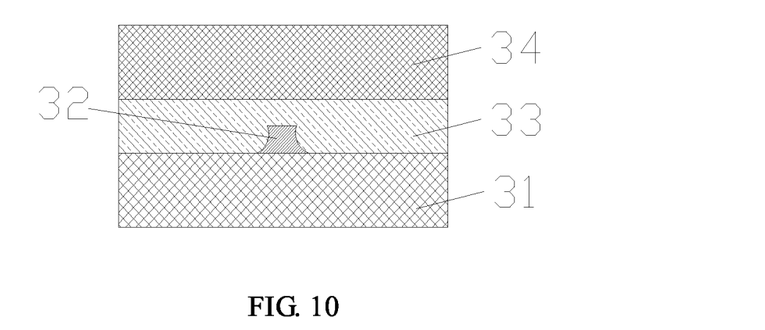

As shown in FIG. 10, a top electrode 34 is deposited on the resistive layer 33 by using a chemical vapor deposition method or a physical vapor deposition method.

Alternatively, a thickness of the top electrode 34 may range from 50 nm to 200 nm. The top electrode 34 may be formed of any metal conductive material that is known or forthcoming, such as Pt or Au.

It is noted that, the growth thickness of the top electrode 34 may be or may not be the same as that of the bottom electrode 31. Also, the material of the top electrode 34 may be or may not be the same as that of the bottom electrode 31. The grow thicknesses and the materials are not limited herein.

According to the method for fabricating the resistive memory in the embodiment of the present invention, while a conventional fabrication method is used, by means of providing the conductive protrusion on the bottom electrode, a "lightning rod" effect may be occurred so that an electric field in the resistive layer is intensively distributed near the conductive protrusion. This significantly increases the possibility of generation of the conductive filament at the conductive protrusion, so that the conductive filament is not randomly formed. Thus, the stability of various parameters of the resistive memory is ensured, and thus the reliability and stability of the operation of the resistive memory are dramatically increased.

Another method for fabricating a resistive memory is provided by a further embodiment of the present invention.

Figure 4:
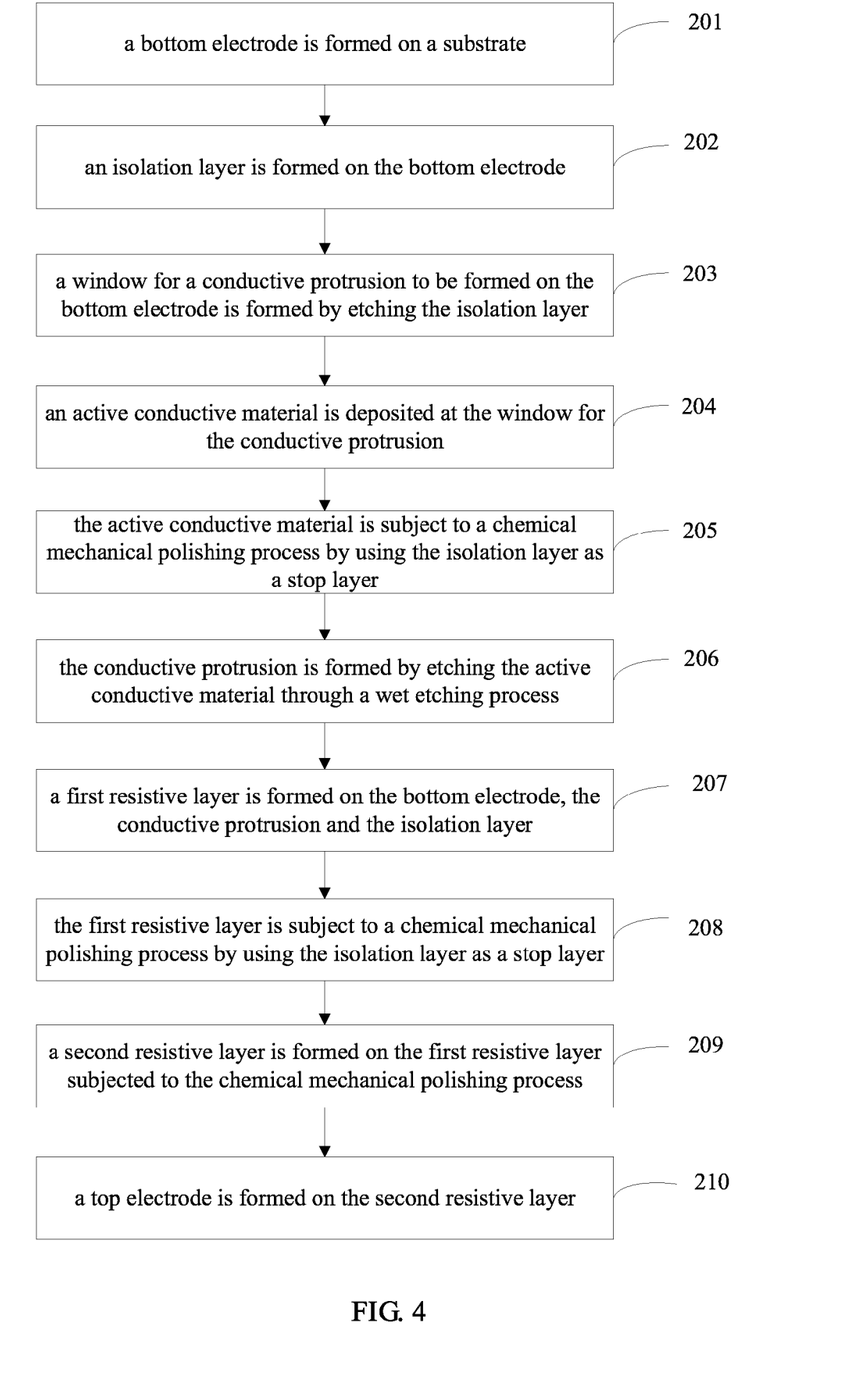
FIG. 4 is a flow chart showing another method for fabricating a resistive memory provided by an embodiment of the present invention.

As shown in FIG. 4, FIG. 4 is a flow chart for illustrating another method for fabricating a resistive memory according to an embodiment of the present invention. The method includes following steps.

At step 201, a bottom electrode formed on a substrate.

A bottom electrode of Pt with a thickness of 150 nm is deposited on a polysilicon substrate through a chemical vapor deposition method.

At step 202, an isolation layer is formed on the bottom electrode.

Figure 11:
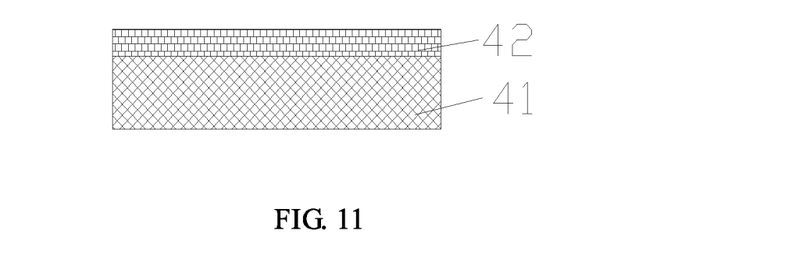
FIGS. 11-19 are schematic views showing another fabrication of a resistive memory provided by an embodiment of the present invention.

As shown in FIG. 11, silicon nitride with a thickness of 50 nm is deposited on the bottom electrode 41 of Pt as an isolation layer 42 through a chemical vapor deposition method.

At step 203, a window for a conductive protrusion to be formed on the bottom electrode is formed by etching the isolation layer.

Figure 12:
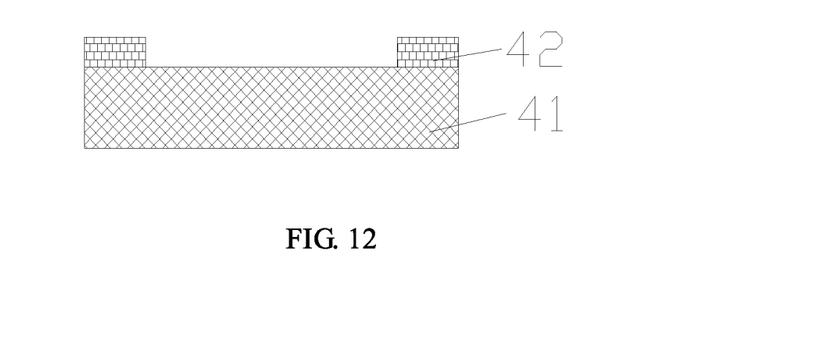

The step includes coating a photoresist on the isolation layer 42 of silicon nitride; forming a square window in a matrix form of 1 μm*1 μm in a central portion of the silicon nitride; removing the silicon nitride located in the window from the bottom electrode by using a photolithography process. As shown in FIG. 12, the window (or a hole) for the conductive protrusion to be formed is formed on the bottom electrode 41.

At step 204, an active conductive material is deposited at the window for the conductive protrusion.

Figure 13:
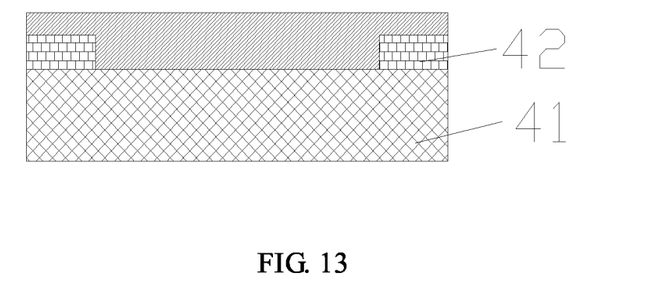

As shown in FIG. 13, a copper seed layer may be formed by a thermal evaporation process, and then a copper layer with a thickness of 100 nm may be coated on the bottom electrode 41 and the isolation 42 by using an electrochemical method.

At step 205, the active conductive material is subject to a chemical mechanical polishing process by using the isolation layer as a stop layer.

Figure 14:
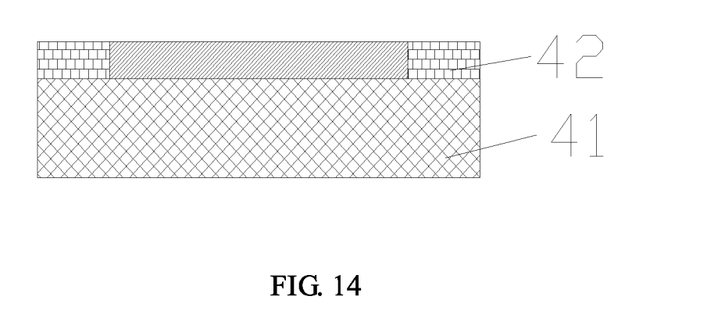

As shown in FIG. 14, the active conductive material, that is, copper, is subject to a chemical mechanical polishing process by using the isolation layer 42 of silicon nitride as a stop layer, so that a thickness of the active conductive material, that is, copper on the bottom electrode 41 is the same as that of the isolation layer 42 of silicon nitride, both being 50 nm.

At step 206, the conductive protrusion is formed by etching the active conductive material through a wet etching process.

Figure 15:
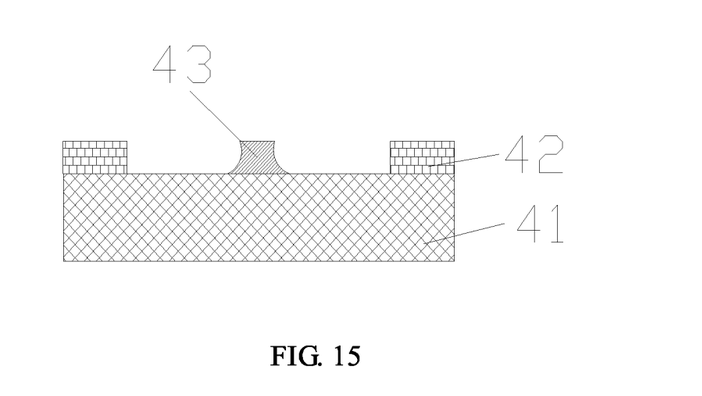

As shown in FIG. 15, a conductive protrusion 43 having a top width larger than a bottom width is formed by etching the active conductive material, that is, copper through a wet etching process.

It is noted that, in order to ensure that there is no copper remaining other than the conductive protrusion 43 left on a surface of the bottom electrode 41 of Pt, the bottom electrode 41 of Pt is over-etched after the copper of 50 nm is etched through a wet etching process.

At step 207, a first resistive layer is formed on the bottom electrode, the conductive protrusion and the isolation layer.

Figure 16:
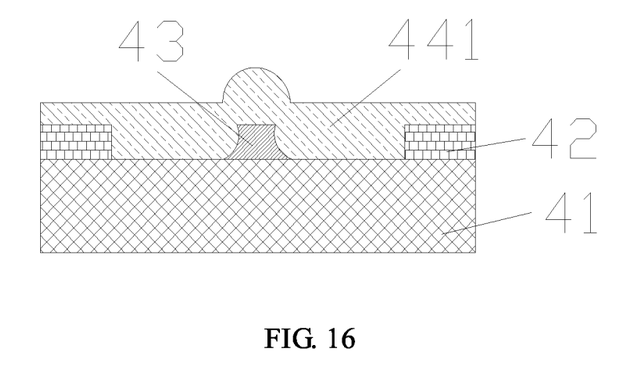

As shown in FIG. 16, a resistive material of hafnium oxide with a thickness of 100 nm is grown on the bottom electrode 41 of Pt, the conductive protrusion 43 of copper and the isolation layer 42 of nitride oxide as a first resistive layer 441.

At step 208, the first resistive layer is subject to a chemical mechanical polishing process by using the isolation layer as a stop layer.

Figure 17:
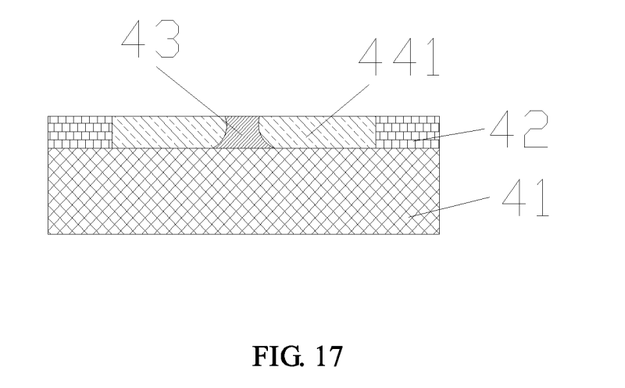

As shown in FIG. 17, the hafnium oxide is subject to a chemical mechanical polishing process by using the isolation layer 42 of nitride oxide as a stop layer, so that an upper surface thereof is even and planarized and a thickness of the first resistive layer 441 is the same as that of the conductive protrusion 43 and that of the isolation layer 42, which are both 50 nm.

At step 209, a second resistive layer is formed on the first resistive layer subjected to the chemical mechanical polishing process.

Figure 18:
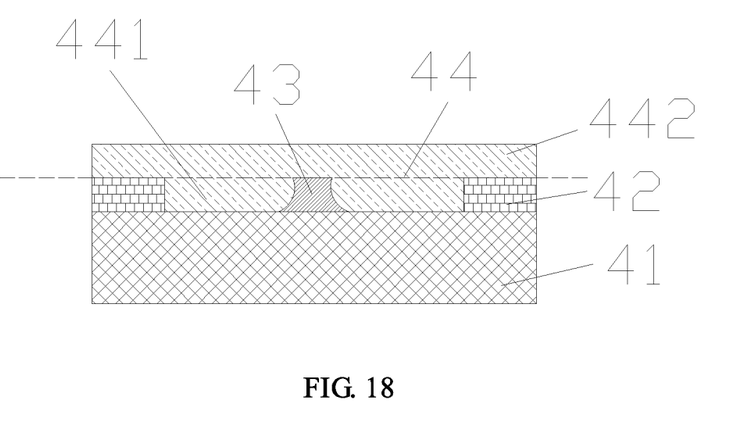

As shown in FIG. 18, similarly, a resistive material of hafnium oxide with a thickness of 30 nm is grown on the first conductive layer 441 subjected to the chemical mechanical polishing process through a chemical vapor deposition process as a second resistive layer 442 (in FIG. 18, a dotted line is indicated for clearly illustrating ranges of the first resistive layer and the second resistive layer, not included in the content of the embodiments of the present invention, neither limiting the present invention in any way). The first resistive layer 441 and the second resistive layer 442 are together to form a resistive layer 44.

At step 210, a top electrode is formed on the second resistive layer.

Figure 19:
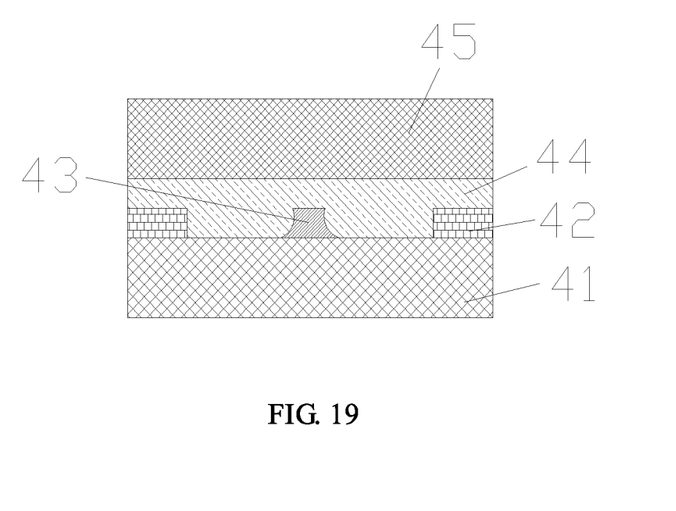

As shown in FIG. 19, a metal layer of Pt with a thickness of 200 nm is evaporated on the resistive layer 44 through an electron beam evaporation process as a top electrode 45.

It is noted that, the resistive layer is comprised of the first resistive layer 441 and the second resistive layer 442 over the first resistive layer 441. Therefore, growing the top electrode 45 on the resistive layer 44 means growing the top electrode 45 on the second resistive layer 442.

The embodiments are examples only, and thus the material, the growth method, the thickness of each component for forming the bottom electrode, the conductive protrusion, the resistive layer, the isolation layer and the top electrode of the resistive memory provided by the present invention are not limited to the contents set forth by the embodiments, which may be other suitable material, growth method and thickness. The detailed description is therefore omitted.

According to the resistive memory and method for fabricating the same provided by the embodiments of the present invention, by means of providing the conductive protrusion on the bottom electrode, a "lightning rod" effect may be occurred so that an electric field in the resistive layer is intensively distributed near the conductive protrusion. This significantly increases the possibility of generation of the conductive filament at the conductive protrusion, so that the conductive filament is not randomly formed. Thus, the stability of various parameters of the resistive memory is ensured, and thus the reliability and stability of the operation of the resistive memory is dramatically increased.

The above merely illustrate preferable embodiments of the present invention, and should limit the present invention in any manner.

While the present invention has been described above as the preferable embodiments, it is not for the purpose of limiting the invention. Various possible changes, modifications or equivalents of the embodiments to the technical solutions of the present invention can be made by those skilled in the art by using the above-mentioned methods and techniques without departing from the spirit or scope of the invention. Therefore, any simple modifications, equivalents, changes and modifications made to the above embodiments according to the technical essence of the present invention, without departing from the contents of the present invention, will fall in the scope of the invention.

What is claimed is:

1. A method for fabricating a resistive memory comprising:
   forming a bottom electrode on a substrate;
   forming a conductive protrusion having a top width smaller than a bottom width on the bottom electrode;
   forming a resistive layer on the bottom electrode and the conductive protrusion, so that the conductive protrusion is embedded in the resistive layer; and
   forming a top electrode on the resistive layer,
   wherein forming the conductive protrusion having the top width smaller than the bottom width on the bottom electrode comprises:
   forming an isolation layer on the bottom electrode;
   forming a window for the conductive protrusion to be formed on the bottom electrode by etching the isolation layer;
   depositing an active conductive material at the window for the conductive protrusion;
   performing a chemical mechanical polishing process on the active conductive material by using the isolation layer as a stop layer; and
   etching the active conductive material through a wet etching process to form the conductive protrusion,
   wherein forming the resistive layer on the bottom electrode and the conductive protrusion comprises:
   forming a first resistive layer on the bottom electrode, the conductive protrusion and the isolation layer;
   performing a chemical mechanical polishing process on the first resistive layer by using the isolation layer as a stop layer; and
   forming a second resistive layer on the first resistive layer subjected to the chemical mechanical polishing process.

* * * * *